United States Patent [19]

Kaufman

[11] 4,196,411

[45] Apr. 1, 1980

[54] DUAL RESISTOR ELEMENT

[75] Inventor: Lance R. Kaufman, Mequon, Wis.

[73] Assignee: Gentron Corporation, Milwaukee, Wis.

[21] Appl. No.: 919,013

[22] Filed: Jun. 26, 1978

[51] Int. Cl.² .................................... H01C 1/012
[52] U.S. Cl. ..................... 338/314; 338/320; 338/325
[58] Field of Search .............. 338/306, 307, 308, 309, 338/314, 320, 325

[56] References Cited

U.S. PATENT DOCUMENTS

| 760,076 | 5/1904 | Leonard | 338/308 X |
|---|---|---|---|
| 1,889,379 | 11/1932 | Ruben | 338/308 X |
| 2,497,507 | 2/1950 | McMaster | 338/308 X |
| 2,775,673 | 12/1956 | Johnson | 338/285 |
| 2,866,061 | 12/1958 | Risk | 338/292 X |
| 3,067,310 | 12/1962 | Walz et al. | 219/543 X |
| 3,185,947 | 5/1965 | Freymodsson | 338/308 X |
| 3,649,366 | 3/1972 | Jordan et al. | 219/543 X |
| 3,838,888 | 10/1974 | Gynn | 338/96 X |

Primary Examiner—C. L. Albritton
Attorney, Agent, or Firm—Andrus, Sceales, Starke & Sawall

[57] ABSTRACT

A resistor comprises a ceramic plate on the opposite surfaces of which a thick film is arranged in a pattern forming respective electrically resistive circuits which are connected by continuing the film or coating over the edge of the substrate plate or by using a bonded metal clip to bridge the gap between the resistive circuits on the opposite surfaces.

5 Claims, 8 Drawing Figures

DUAL RESISTOR ELEMENT

This invention relates to an electric resistor comprising a ceramic substrate on which a layer of resistive material is deposited in a predetermined pattern.

A resistor of this general type is disclosed in U.S. Pat. No. 3,838,888. The resistor in this patent comprises a ceramic substrate having a resistive layer or pattern formed on one side to define a plurality of resistive paths which are connected in common at one portion and are each disposed for progressive engagement of a contact element at another portion. This type of resistor is adapted for cooperating with movable contacts for varying the resistivity in an electric circuit. A use of a resistor of the type which is illustrated in the cited patent is for varying the current flowing through the operating coils of electromagnetic vehicle brakes and this is an illustrative but not exclusive use of the resistor described herein.

The prior art resistor is characterized by having the resistive layer formed in a pattern or circuit on one surface of a ceramic substrate which has its other bare surface interfacing with a heat sink. When mounted in this manner the resistor may be contacted at intermediate points along its path with a multiple finger movable contact to thereby vary the electrical resistance in a circuit in which the resistor and contact are connected.

A disadvantage of the prior art resistor is that all of the heat due to the high current flowing through it is generated on one surface. This produces high thermal stresses within the substrate and results in it cracking during alternate heating and cooling cycles. Another disadvantage is that the substrate must have unduly large area when the entire resistive circuit is deposited on and spread out on only one surface or side of the substrate.

SUMMARY OF THE INVENTION

In accordance with the invention, an insulating substrate member has first and second differently facing surfaces. A layer or thick film of electrically resistive material is bonded to each surface in patterns that form resistive circuits and these circuits are connected together by continuing the layer or by bonding a metal clip across one or more edge surfaces of the substrate.

Objects of the invention are to provide a resistor that has enhanced heat dissipation characteristics, that minimizes thermal distortion and maximizes the amount of resistivity that can be developed within a given space.

How the foregoing and other more specific objects of the invention are achieved will be explained in the ensuing description of an illustrative embodiment of the invention taken in conjunction with the drawing.

DESCRIPTION OF A PREFERRED EMBODIMENT

Figure 1:
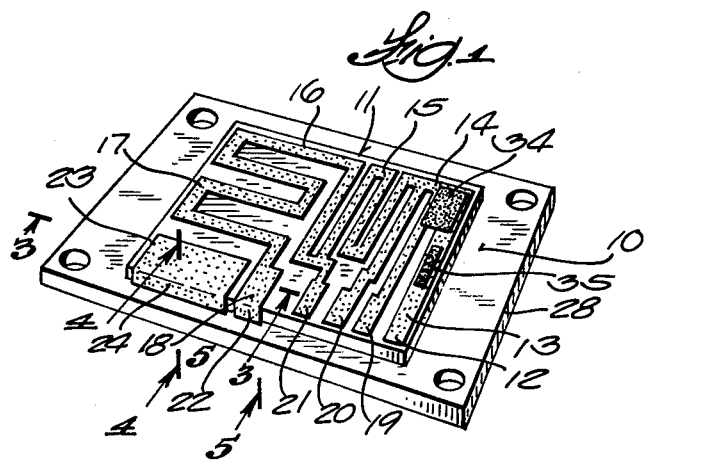
FIG. 1 is a plan view of the resistor on a substrate which is mounted on a heat sink, this view showing the resistive pattern on one surface of the substrate.

In FIG. 1, the resistor is shown as comprising a rectangular plate or substrate 10 of insulating material which is preferably ceramic. A resistive circuit 11 having a labyrinth pattern in this example is deposited on the exposed surface of substrate 10. Resistive circuit 11 is created by depositing a patterned layer of resistive metal on the substrate surfaces using conventional techniques. For instance, it may be deposited by sputtering or by metal vaporization. Another method is to entrain fine electrically resistive particles in a volatile fluid vehicle and use this substance to print the resistive circuit pattern on the substrate. As is known, after the vehicle is evaporated, the coated substrate is fired to bond the particles to the substrate surface. The resistive pattern can also be produced by depositing a layer of resistive material on the whole substrate surface and then etching portions away so that only the desired resistive paths remain. The resistive paths may be formed by applying a palladium and silver alloy or gold, platinum-silver, ruthenium oxide or a film of any material that would provide major or minor electrical resistance.

The thick film resistor depicted in FIG. 1 is especially useful in electric circuits in which resistance variations are desired such as in controlling electric motor speed or the field strength of an electromagnet. Usually this requires connecting resistors in series and parallel combinations to achieve the desired resistance and current carrying capacity. The embodiment of the two-sided resistor depicted in FIG. 1 is especially designed for that purpose.

As is evident by inspection of the first embodiment of the two-sided resistor depicted in FIG. 1, a series resistive circuit may originate at the end 12 of one of the strip portions 13 that constitutes a layer of resistive material. The strip portions such as 13 and ensuing portions 14, 15, 16 and 17 are in a series circuit which ends on the top surface of substrate 10 in a rectangular zone 18. If more or less resistance than is obtained soley with the metallized paths is desired, lower or high valued resistive segments such as those marked 34 and 35 may be deposited across suitable openings which have been allowed to remain in the metallized paths. Taps or contactable terminal portions such as 19, 20 and 21 may also be formed in the resistive pattern. This permits adding or removing more and more resistance in the circuit by simply using a suitable contactor to shunt across the gaps between terminal portions 12, 19, 20, 21 and 18.

Note in the FIG. 1 embodiment that the terminal portion 18 on the top or first surface of ceramic substrate 10 extends down the edge or third surface which is marked 22 and is mutually contiguous with the top and bottom or second surface of substrate 10. In accordance with the invention, this is one of the ways in which the resistive circuit on the top surface is made continuous with a resistive circuit on the bottom surface which appears in FIG. 2. Note further in FIG. 1 that there is an open ended resistive portion 23 on the top surface which is in electrical continuity with a circuit on the bottom surface of the substrate as a result of the layer continuing along the edge of the substrate as indicated by the reference numeral 24. In another embodiment, which will be described later in reference to FIGS. 7 and 8, electrical continuity between resistive circuits is obtained by using a metal clip that contacts both sides of the substrate and passes along its edge.

Figure 2:
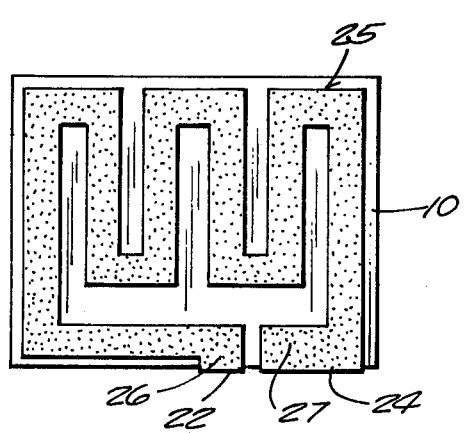
FIG. 2 is a plan view of the rear resistive pattern bearing surface of the substrate which is depicted in FIG. 1 and which interferes with the heat sink.

Referring to FIG. 2, one may see that the resistive circuit on the rear or bottom side of substrate 10 of the FIG. 1 embodiment is formed in a serpentine or zigzag pattern which starts in a portion 26 and terminates in a portion 27. The portion 26 is continuous with that portion 22 of the layer which runs along the edge of substrate 10 and merges with terminal portion 18 in the top circuit. End portion 27 in FIG. 2 is continuous with that portion 24 which runs along the substrate and merges with portion 23 on the top surface. If end portion 12 on the top surface in FIG. 1 is considered to be the start of an electric circuit, the circuit can be traced along the continuous pattern on the top surface to its end portion 18 after which it continues along the edge layer 22 where it joins the end portion 26 on the bottom surface as seen in FIG. 2. The circuit continues through the zigzag pattern on the bottom surface in FIG. 2 and ends on the bottom surface in the portion of the resistive layer marked 27. It then continues along the edge portion 24 and terminates in top portion 23.

Note that the portions of the layer on the top surface of the substrate 10 in FIG. 1 are arranged quite uniformly so that substantial temperature differentials will not develop between the opposite sides and ends of the substrate. The same is true with respect to the pattern formed on the bottom of the substrate as shown in FIG. 2. Note also that the limiting sides and edges of the generally rectangular resistive patterns are substantially congruent. In other words, the resistive patterns on the top and bottom surfaces of the substrate have about the same overall size so that isolated hot and cold spots over the length and width of the substrate are not likely to develop. This reduces internal thermal stress in the substrate and helps to maintain its dimensional stability even though it is subjected to severe thermal cycling. In the depicted arrangement, as long as current is flowing through the resistive paths on the top surface of the substrate there will be conduction through the continuous resistive paths on the bottom surface so the substrate will be heated rather uniformly from both sides which is desirable.

Figure 4:
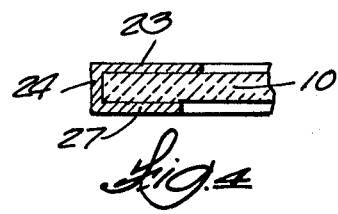
FIG. 4 is a fragmentary section taken on a line corresponding with 4—4 in FIG. 1.
Figure 5:
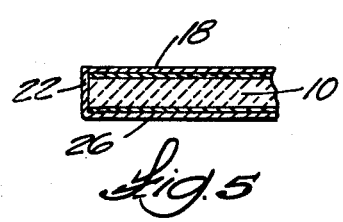
FIG. 5 is a fragmentary section taken along a line corresponding with 5—5 in FIG. 1.

FIG. 4 further shows how the resistive portion 23 on the top or first surface of substrate 10 connects with portion 27 on the second or bottom surface of the substrate by means of layer 24 extending continuously along a third or edge surface of the substrate. FIG. 5 further illustrates how top resistive portion 18 connects with bottom resistive portion 26 on substrate 10 through the agency of continuing resistive portion 22 on the edge of substrate 10.

Figure 7:
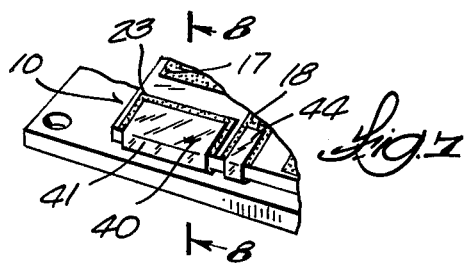
FIG. 7 is a fragment of an alternative embodiment of the two-sided resistor wherein a metal clip is used to connect between resistive circuits on opposite surfaces of a substrate.
Figure 8:
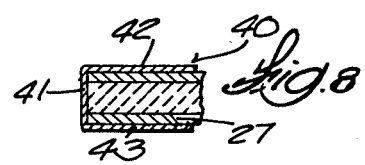
FIG. 8 is a partial section taken on a line corresponding with 8—8 in FIG. 7.

FIGS. 7 and 8 illustrate a technique which uses a metallic foil clip rather than metallization to produce electrical continuity between thick film resistive circuits which have been deposited on opposite sides of an insulating substrate. The FIGS. 7 and 8 embodiment may be considered to be otherwise similar to the illustrative embodiment shown in FIGS. 1 to 5. Similar parts are identified by the same reference numerals in the two sets of figures.

In FIG. 7 portions 17, 18 and 23 of the metallized or thick film resistive patterns on ceramic substrate 10 are visible. Note that the metallization such as portion 23 does not run along the edge of substrate 10 in this example although it could do so. A metallic foil clip 40 is used to connect electrically the metallized portion 23 on top of substrate 10 to a portion such as 27, visible in FIG. 8, on the bottom. The mid portion 41 of the foil clip runs down the substrate edge for effecting electrical continuity.

Metallic foil or clip 40 might be about 0.001 inch thick by way of example and not limitation. In one product, a foil designated by the trademark "Hymu 80" was used but other metallic foils could be used too. The foil is applied to the metallized areas by first applying solder paste to one face. The top area 42, mid area 41 and bottom area 43 are pressed onto the metallization on both sides of the substrate and fired at about 350° C. to cause reflow and soldering to the metallization.

Another foil clip 44 in FIG. 7 illustrates that a plurality of conductive bridges can be effected easily with the foils. This makes it easy to remodel circuits on opposed sides of a substrate for special orders.

An advantage of using a foil clip instead of continuous metallization along the substrate edge is that the inconvenience of printing the metallizing material or vapor depositing it on a thin substrate edge can be avoided.

Figure 3:
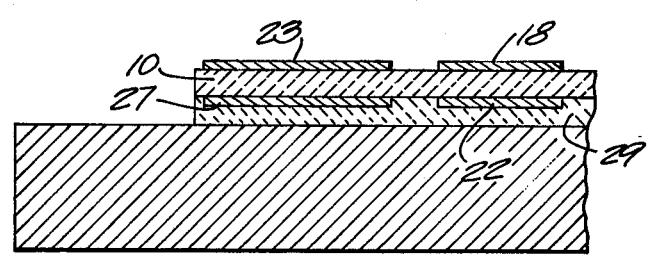
FIG. 3 is a fragmentary section taken on a line corresponding with 3—3 in FIG. 1.

The new multi-sided resistor is intended primarily for use where current and, hence, heat dissipation are high in spite of the small size of the resistor. By way of example, one commerical resistor made in accordance with the invention, has a total resistance of 1 ohm. Generally, the resistive coatings are on the order of 0.001 to 0.0005 of an inch thick. The resistive pattern extends nearly to the edges of the substrate 10 which is about 1.25 inches long and 1.0 inch wide and has a thickness of about 0.05 inch. It is used in a circuit adapted for handling 12 amperes at about 12 volts so that the dissipation is about 144 watts. Loading a resistor of this size so heavily dictates the advisability of mounting the resistor on a heat sink. This is illustrated in FIG. 3. The heat sink is marked 28. It is shown as a metal block but may have other configurations. The substrate 10, having the resistive patterns on its top and bottom surfaces, is bonded to the heat sink with a resin layer 29 whose thickness is shown exaggerated for the sake of clarity. The resin layer, or whatever insulating bonding material is used, only needs to be thick enough to withstand the voltage applied to the circuit with a fair margin of safety. Thus, in most applications, where comparatively low control voltages are used, the resin layer will be only about 0.04 inch thick. A bonding material comprised of epoxy resin in which fine particles of ceramic are entrained has been found to be a very staisfactory substance for bonding the resistor to a heat sink.

Another suggested way of getting good heat exchange relationship between the resistor and a heat sink is to interpose a vinyl sheet, not shown, having fine ceramic particles embedded in its between the resistor and heat sink and applying pressure to the resistor. The resistor may also be disposed between two parallel plates that serve as heat sinks and the ceramic entraining vinyl sheets may be interposed between both top and bottom surfaces and the heat sink plates.

Figure 6:
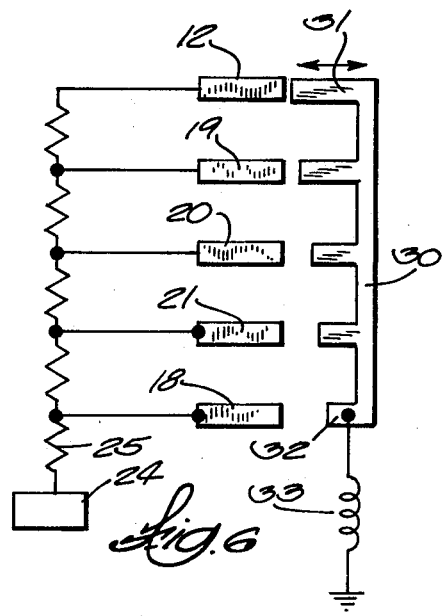
FIG. 6 is a schematic diagram of the new resistor in an electric circuit.

Use of the resistor is depicted symbolically in FIG. 6 where the contact portions 18, 21, 20, 19 and 12 are symbolized by rectangles. The straight portions of the resistive pattern are given the usual symbol for electrical resistances. The top terminal portion 24 may be considered the starting point of the circuit. This portion may be contacted with a contact, not shown, that connects to one line of a power supply. The resistor cooperates with a movable contactor 30 which is illustrated as having fingers such as 31 and 32 of varying lengths. An electromagnetic brake coil 33, for example, may have one of its ends connected to contactor 30 and its other end to ground or the other side of the power line. When contact 31 is shifted to the left, the first finger 31 makes contact with portion 12 and current flows from portion 24 through contactor 30 and maximum resistance is in the circuit. When contactor 30 is shifted further to the left, the next contact finger engages with resistor portion 19 so that the topmost resistor is now in parallel with the next one and total resistance is reduced. When all of the contacts 12–18 in FIG. 6 are in contacts with fingers on contactor 30, there is minimum resistance in the circuit and current flow is limited only by the resistance of pattern 25 which is on the bottom surface of the substrate. Of course, the pattern may be variously designed to provide the amounts and gradations of resistance that are required for any particular application.

It will be evident to those skilled in the art that gaps may be left in some of the resistive portions and they can be filled in or bridged by resistive material that has higher or lower resistance than the marjority of the layer material so that the resistance can be trimmed to exact values overall or in any selected one of the resistive steps or portions. The techniques for applying suitable thick film resistors for bridging the gaps are sufficiently well-known to obviate the need for further discussion.

Although the new resistor has been described in considerable detail, such description is intended to be illustrative rather than limiting, for the resistor may be variously embodied and is to be limited only by interpretation of the claims which follow.

I claim:

1. A resistor for cooperating with a relatively movable contact means to provide steps of resistance in an electric circuit, said resistor comprising:

a substrate member comprised of electrically insulating material and having first and second opposite parallel and planar major surfaces and edge surfaces extending between the major surfaces, a plurality of strips of electrically resistive material bonded to said first major surface, said strips being electrically continuous and being disposed in a zigzag arrangement on said first surface, the ends of said strips forming said zigzag arrangement being spaced from each other and being adjacent one edge of said substrate, said ends constituting terminals for cooperating with contact means, a plurality of additional strips of electrically resistive material bonded to said first major surface, said additional strips extending in electrical continuity from said zigzag strips intermediate their ends, said additional strips having ends terminating adjacent said one edge coplanar with and in spaced relation with said ends of said zigzag strips, the ends of said additional strips also constituting terminals for cooperating with contact means to provide said steps of resistance, another plurality of strips of electrically resistive material bonded to said second major surface, said other strips being electrically continuous and being disposed in a zigzag arrangement on said second surface, said last named strips having opposite ends one of which extends from said second surface along said one edge and to said first surface to form a terminal adjacent said one edge and in spaced relation with respect to said other ends which constitute terminals for cooperating with contact means, the other of said opposite ends of said other plurality of strips on said second surface extending along said one edge to join with one terminal end of said zigzag arrangement on said first surface.

2. The resistor as in claim 1 wherein said substrate comprises a ceramic plate.

3. The resistor as in claim 1 wherein said coating of resistive material is selected from the group consisting of an alloy of palladium and silver, a platinum and silver alloy, and ruthenium oxide.

4. The resistor as in claim 1 including a body of heat conductive material comprising a heat sink, and a heat conductive electrically insulating material interposed between said resistor and said heat sink for adhering said resistor to said heat sink and for conducting heat away from said resistor.

5. The resistor as in claim 1 including a body of heat conductive material comprising a heat sink, and a resin containing ceramic particles interposed between said resistor and said heat sink for adhering said resistor to said heat sink and for conducting heat away from said resistor.

* * * * *

UNITED STATES PATENT AND TRADEMARK OFFICE
CERTIFICATE OF CORRECTION

PATENT NO. : 4,196,411
DATED : April 1, 1980
INVENTOR(S) : Lance R. Kaufman

It is certified that error appears in the above-identified patent and that said Letters Patent are hereby corrected as shown below:

Column 4, Line 58      After "very" cancel "staisfactory" and substitute therefore --- satisfactory ---;

Column 4, Line 63      After "in" cancel "its" and substitute therefore --- it ---

Signed and Sealed this

Second Day of December 1980

[SEAL]

Attest:

SIDNEY A. DIAMOND

Attesting Officer      Commissioner of Patents and Trademarks